United States Patent

Altekrüger et al.

[11] Patent Number: 6,126,745
[45] Date of Patent: Oct. 3, 2000

[54] DEVICE FOR CONTROLLING CRYSTAL GROWTH PROCESSES

[75] Inventors: Burkhard Altekrüger; Joachim Aufreiter, both of Alzenau; Dieter Brüss, Bruchköbel; Klaus Kalkowski, Gründau, all of Germany

[73] Assignee: Leybold Systems GmbH, Hanau, Germany

[21] Appl. No.: 09/252,667

[22] Filed: Feb. 19, 1999

[30] Foreign Application Priority Data

Feb. 19, 1998 [DE] Germany ............... 198 06 949

[51] Int. Cl.[7] .................................. C30B 35/00
[52] U.S. Cl. ............... 117/201; 117/14; 117/202
[58] Field of Search ............... 117/14, 200, 201, 117/202, 900

[56] References Cited

FOREIGN PATENT DOCUMENTS

0821082 1/1998 European Pat. Off. .
1457275 12/1976 United Kingdom .

*Primary Examiner*—Felisa Hiteshew
*Attorney, Agent, or Firm*—Smith, Gambrell & Russell, LLP

[57] ABSTRACT

A device for controlling crystal growth processes which run through various process phases, for instance, melting or cool-down, and in which the shape of the crystal has different areas during growth, for instance, a neck and/or a shoulder. Certain process parameters and target values, as well as input values and output values, for instance, a certain gas pressure or a certain rotational speed, are also associated with each of these areas and phases. The linking of these parameters is accomplished by function generators or tables. With the aid of the control device, it is made possible to generate a specially adapted linking of the respectively necessary input and output parameters for each of the special process phases and crystal sections with an essentially uniform construction and a comprehensible structure. This permits an optimized process operation with high reproducibility, in which manual interventions by the operating personnel during the entire process and also during the transition phases between different process steps are not necessary.

17 Claims, 9 Drawing Sheets

DEVICE FOR CONTROLLING CRYSTAL GROWTH PROCESSES

INTRODUCTION AND BACKGROUND

The present invention relates to the field of controlling crystal growth. More particularly, the present invention relates to a device for controlling crystal growth processes in which different process phases of the overall process can be distinguished, for instance, the phases of the melting process for the starting material or of the cooling of the residual melt or the phases during which the neck, the shoulder or the body of the crystal are subjected to a defined control strategy. Measured values such as the diameter of the crystal neck are detected during these phases and are fed to an evaluation device which influences the process variables such as the heating temperature of a crucible. In a detailed aspect of the invention, the evaluation device comprises an allocation device which allocates each process variable measured during a phase, as the neck diameter of a crystal, for instance, with a defined process variable. Such process variables include for instance, temperature of the crucible or crystal turning velocity.

A monocrystal is understood to mean a single homogeneous crystal, the atoms of which are arranged homogeneously in a three-dimensional lattice. Monocrystals thus differ from other materials, such as polycrystalline or amorphous bodies, by their regular structure, which is also evident from external observation.

In order to grow such monocrystals, the appropriate materials such as germanium or silicon are first melted and then crystals are obtained from this melt by certain processes.

In most of these processes it is a prerequisite that either only one seed forms or one seed grows preferably rapidly. Rod-shaped monocrystals are produced as a rule by solidification of the melt in a temperature gradient. In these processes, including the so-called 30Bridgman method, the melt is located in a crucible which is moved at a slow speed adapted to the crystallization rate of the respective material through a temperature gradient of 10–100°/cm including the melting point.

So-called zone melting is also applied as a modification of this principle.

For drawing out of the melt, according to the so-called "Czochralski method", a small monocrystalline piece of the material, the seed crystal, is dipped into the melt and, after adjustment of the temperature equilibrium at the boundary surface between liquid and solid, is drawn out at a uniform rate. This drawing rate is controlled. In the process, additional material constantly crystallizes onto the lower end of the incipient monocrystal.

The physical parameters with which the growth of such a monocrystal can be influenced are, for instance, the temperature of the melt or the drawing rate.

In order for the aforementioned or other monocrystal-producing processes to run properly, special regulation methods or devices are necessary.

For example, in order to regulate the cross section of the grown crystal in a Czochralski process, a device is already known with which a first signal, corresponding to the inertial mass of the crystal, is compared to a second signal that corresponds to a reference signal (British Patent No. 1,457,275). This reference signal corresponds at any time to the expected value for the first signal. The deviation value between the two signals is called on for the regulation of the cross section. The heating for the melt and an electric motor for driving a crystal-raising rod are also controlled.

It is disadvantageous in this regulation method that only one parameter can be controlled with it, namely, the cross section of the drawn crystal. Regulation of the different areas in a crystal, for instance, the neck or the shoulder, is not possible with the known method.

Also known is a method for controlling the growth of a crystal in which the growth is determined by a set of measurable and nonmeasurable variables (published European Patent Application No. 0,821,082). This method includes preparing an on-line simulation software with a reduced number of variables, the reduction in the number of variables being obtained by the utilization of a projection algorithm. This software is then accelerated in that a database is generated, in which values of variables calculated off-line are stored. Thereafter the on-line software is adapted to the results which are obtained by the off-line simulation and by measurements by adjusting the results which were predicted by the on-line simulations. Then a control loop is formed and at least one of the variables is regulated in real time, where the control loop uses the accelerated and adapted on-line simulation as an online observer. The measurable and nonmeasurable variables here include drawing rate, heating power, temperature distribution in the crystal, melt flow characteristics, temperature distribution on the inner surface of the quartz crucible, temperature distribution on the surface of the melt, the shape of the solid-liquid boundary and the vaporization of SiO. Disadvantageous in this method is the fact that different strategies are applied in the regulation of different sections of a crystal, for instance, the neck or the body.

Therefore, it is an object of the present invention to have the same regulation strategies for all different areas of a crystal.

SUMMARY OF THE INVENTION

The above and other objects of the present invention can be attained by a method and device for controlling crystal growth processes which run through various process phases, for instance, melting or cool-down, and in which the shape of the crystal has different areas during growth, for instance, a neck and/or a shoulder. Certain process parameters and target values, as well as input values and output values, for instance, a certain gas pressure or a certain rotational speed, are also associated with each of these areas and phases. The linking of these parameters is accomplished by function generators or tables. With the aid of a control device according to the invention, it is made possible to generate a specially adapted linking of the respectively necessary input and output parameters for each of the special process phases and crystal sections with an essentially uniform construction and a comprehensible structure. This permits an optimized control of the process with high reproducibility, in which manual interventions by the operating personnel during the entire process and also during the transition phases between different process sections are not necessary.

More particularly, a feature of the present invention is a device for controlling crystal growth processes in which different process phases can be distinguished, for instance, the phases of the melting process for the starting material or of the cooling of the residual melt or the phases during which the neck, the shoulder or the body of the crystal are subjected to a defined control strategy, wherein measured values such as the diameter of the crystal neck are detected during this phase and fed to an evaluation device which influences the process variables such as the heating temperature of a crucible. The evaluation device comprises an allocation device which coordinates each process variable measured during a phase, such as the neck diameter of a crystal, with a defined process variable, for instance, temperature of a crucible or crystal turning velocity.

BRIEF DESCRIPTION OF THE DRAWINGS

The present invention will be further understood with reference to the drawings, wherein.

DETAILED DESCRIPTION OF INVENTION

The advantages achieved with the invention reside in particular in the fact that, for instance, the percentage portion of a crystal neck on the total crystal can be determined and automatically regulated. Furthermore, additional phases of the growing process, such as the melting process of the starting material or the cooling process of the crystal and the residual melt, can also be regulated.

It is additionally possible with the control device according to the invention for the entire growth process, starting with the evacuation of the system, pump-down, to the growth of the last crystal section, the end cone, as well as the cool-down phase, to be performed completely automatically. The invention thus pertains to a method for controlling crystal growing processes which pass through different process phases—for instance, melting or cool-down—and in which the shape of the crystal during growth exhibits different areas, for instance, a neck and/or a shoulder. Certain process parameters and target magnitudes, as well as input values and output values, a certain gas pressure or a certain crystal rotation velocity, for example, are also associated with each of these areas and phases. The linking of these parameters is accomplished by way of function generators or tables.

With the aid of a control device according to the invention, it is possible with, in principle, a uniform construction and a comprehensible structure, to generate a specially adapted linking of the respective necessary input and output parameters for each of the special process phases and crystal sections. This permits an optimized process guidance with high reproducibility in which manual interventions by the operating personnel during the entire process and also during the transition phases between different process sections are not necessary.

Figure 1:
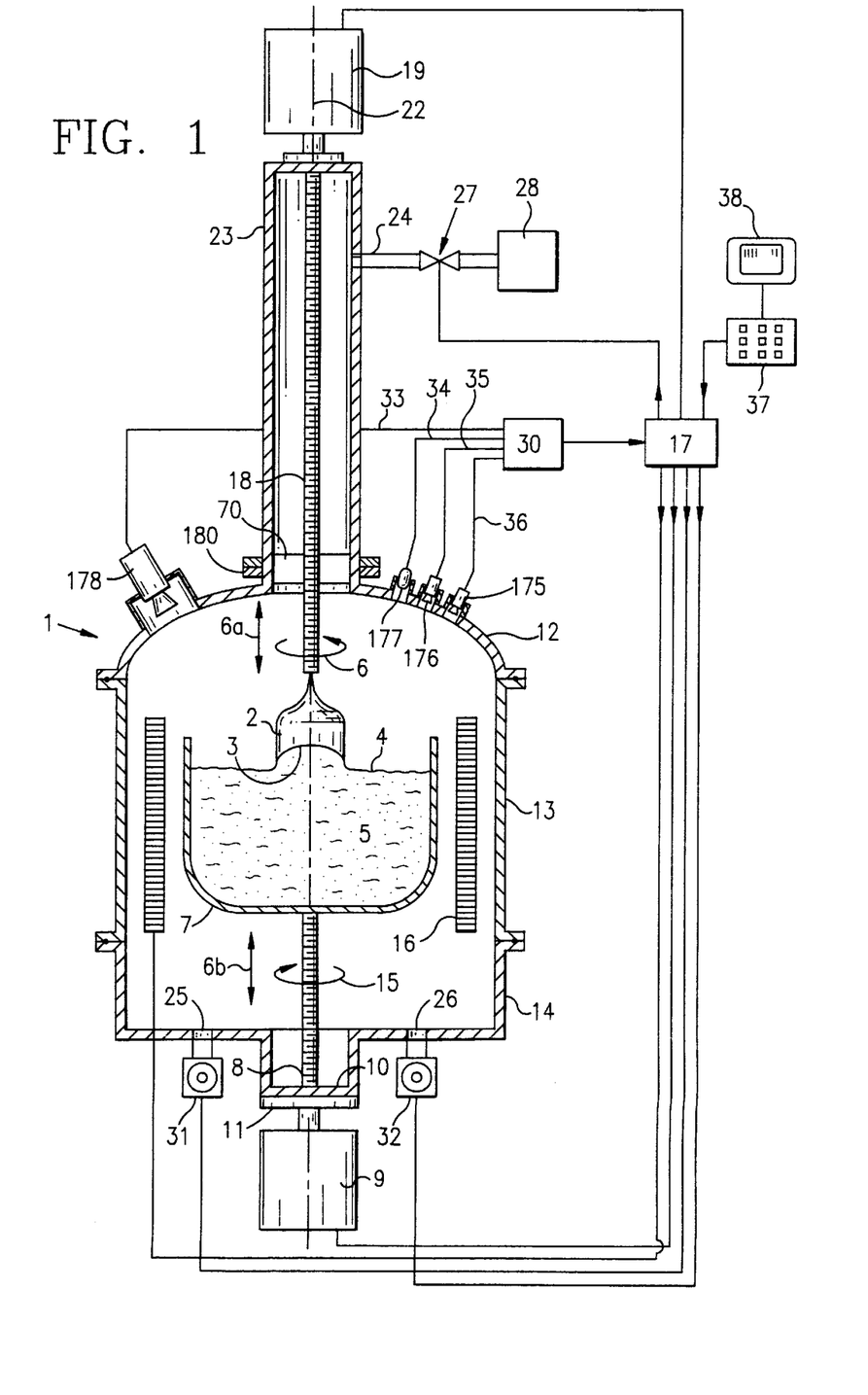
FIG. 1 is a cross-sectional schematic representation of a crystal-drawing device in which several sensors are employed according to the invention.

In FIG. 1, a device 1 is illustrated with which it is possible to draw a crystal 2 out of a melt 5 where the underside 3 of the crystal is in contact with the surface 4 of the melt 5. The crystal is rotated here in the direction of the arrow 6 and displaced vertically in the direction of the arrow 6a. The melt 5 is located in a crucible 7 which is rotatably driven by a rotary and lifting drive by means of a shaft 8. The rotary and lifting drive consists of shaft 8 and motor 9. Shaft 8 and motor 9 are connected. The crucible 7 is located in a housing (process chamber) that includes an upper part 12 or cover, a middle part 13 defining the major section of the housing and a lower part 14 including the bottom and can be rotated and vertically displaced as shown, respectively, by the arrows 15 and 6b. An electrical heating unit 16 that is supplied with electric power is arranged around the crucible 7.

The turning of the crystal 2 is accomplished by means of a rod 18 that is driven by a motor 19. This motor 19 is likewise supplied with electric power from the unit 17.

The rod 18, whose vertical axis is labeled 22, is surrounded by a tubular air lock chamber 23 which is in connection with and open to the upper part 12 of the housing. This air lock chamber 23 has a gas inlet opening 24, while gas outlet openings 25,26 are provided in the bottom part 14 of the housing. The rod 18 can not only be rotated by means of the motor 19, but can also be raised. The controlling of the motor 9,19 is accomplished by the unit 17, which is supplied with various operating-state information from a device 30. The unit 17 also controls a valve 27 which is arranged between a gas reservoir 28 and the gas inlet opening 24. With this valve 27, the inflow of a gas into the tube 23, and thus into the container 12,13,14, can be controlled.

At the gas outlet openings 25,26, pumps 31,32 are provided with which gas in the process chamber 12,13,14 can be drawn off. The controlling of these pumps 31,32 is accomplished via the unit 17. Different inputs 33, 34, 35, 36 are provided to the evaluation device 30. These inputs 33, 34, 35, 36 represent different parameters of the device 1 which are measured by, for instance, sensors 175, 176 and gas pressure meter 177. Thus, a measured value that refers to the contour of the crystal as detected by means of a camera 178 can be present at the input 33. At the input 34, a measured value which is supplied by a gas pressure meter 177 can be present, while data supplied by the sensors 175,176 (pyrometers) on the temperature of the melt 5 and the heating unit 16, respectively, can be transmitted to the evaluation device 30 through the inputs 35,36. It is understood that the aforementioned measured parameters are mentioned only by way of example. It goes without saying that more than the four measured values can be determined. Other measured values, for instance, measured rotational speeds of the motors 9,19 can be present at the input of the evaluation device 30. The task of the evaluation device 30 is to prepare measured data in a form suited to the unit 17. An input keyboard 37 with which certain specifications can be made is also present. This input keyboard 37 can be connected to a monitor 38 on which the specifications and data are displayed.

Figure 2:
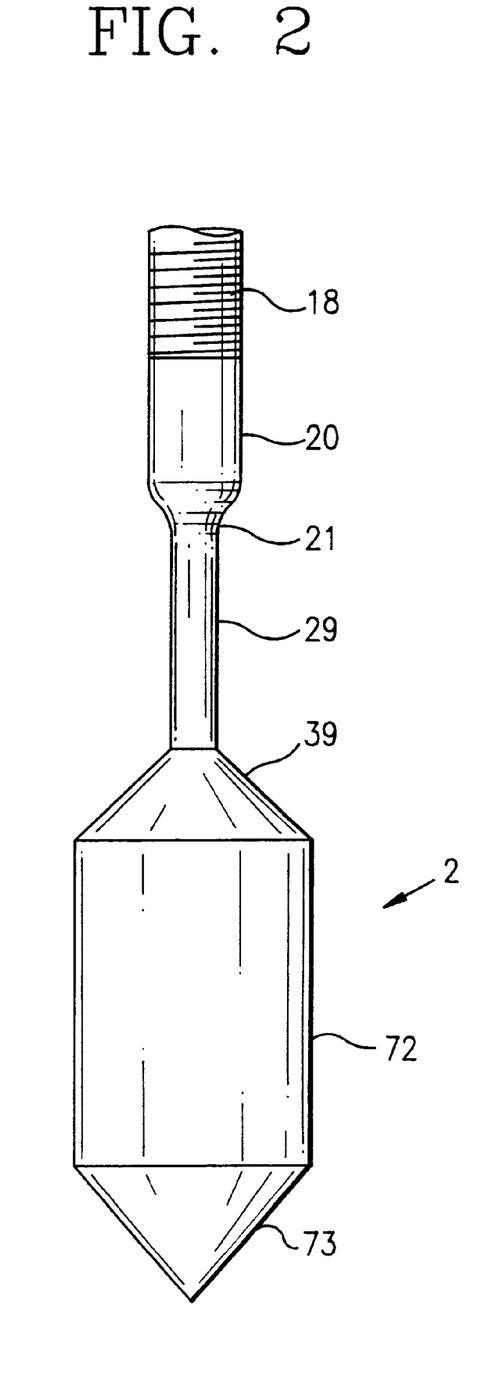
FIG. 2 is an elevational view of different areas of a crystal which occur during a crystal-drawing process.

In FIG. 2, a drawn crystal 2 is shown with its various areas, which result during different stages of the crystal growth process. The representation of the crystal 2 is made for purposes of nonambiguity and clarity of the concepts utilized. It is understood that the crystal illustrated in FIG. 2 refers to the Czochralski process, but that the invention is not limited to this process.

On the rod 18, a seed 20 is provided by means of a seed chuck, which, when it is dipped into the melt 5 and then drawn back up again, forms a neck cone 21. Contiguous to this neck cone 21 is a neck 29 that forms during the drawing out of the crystal and is adjoined by a shoulder 39. This shoulder 39 transforms into the cylindrical body 72, which is terminated by an end cone 73.

The different areas 20,21,29,39,72,73 arise at different times during the production process of a crystal 2. In order for all these areas 20,21,29,39,72,73 to meet the prescribed or specified geometrical conditions, the stated values of the production process, e.g., drawing rate, rotation, gas flow, gas pressure, temperature and the like must be exactly adapted to one another in each area.

Figure 3:
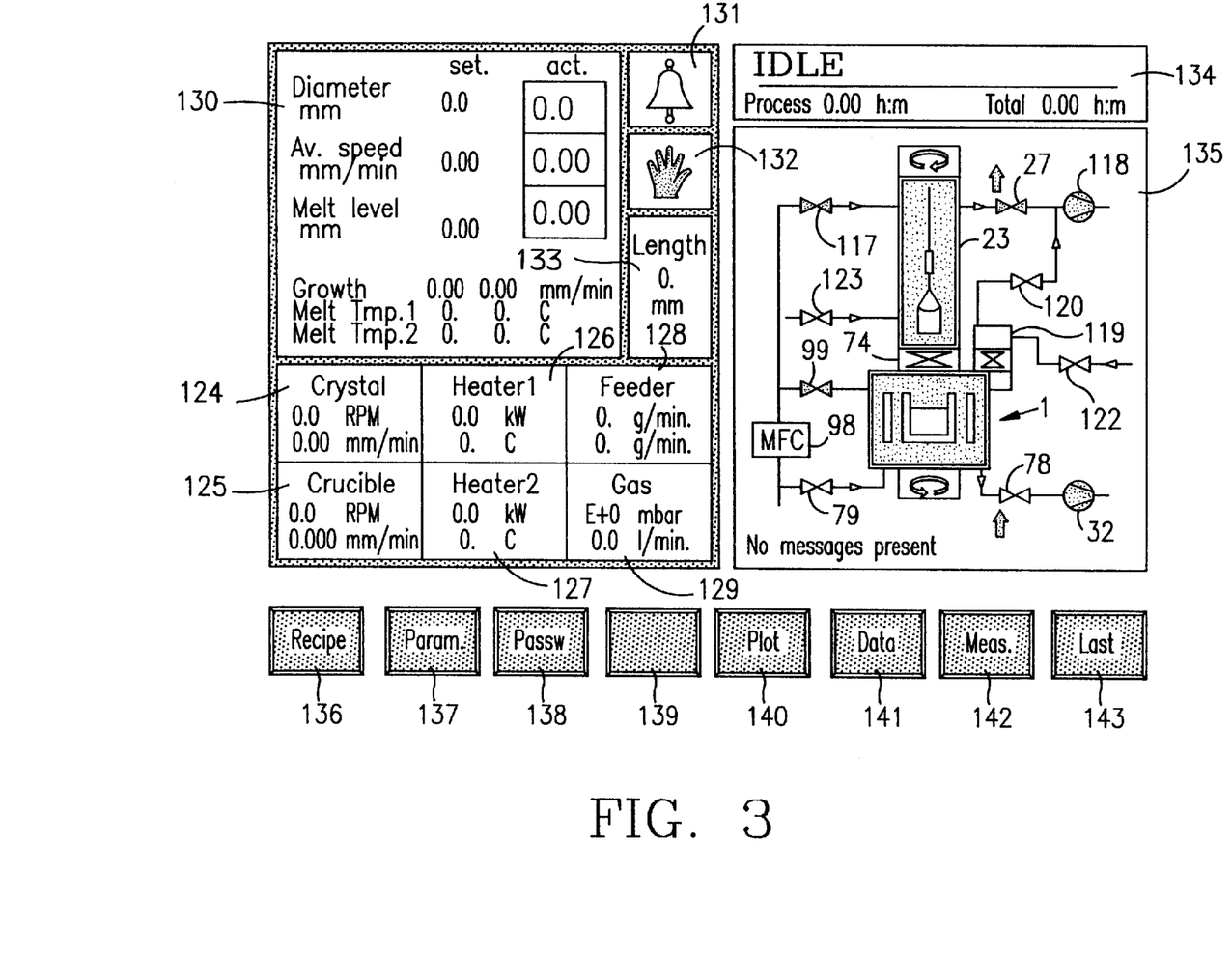
FIG. 3 is a simplified view of a computer screen showing a basic plan for the implementation of the invention.

In order to achieve this adaptation, a main menu, shown in FIG. 3, is called up on the screen of the computer monitor 38 by operating the keyboard 37. On the right side, this main menu shows in symbolized form a modified arrangement of FIG. 1, wherein the lower process chambers 14,13,12 are separated from the air lock chamber 23 by means of a valve 74. In this way, it is possible to remove a finished crystal 2 from the air lock chamber 23 with a closed valve and to draw a new crystal with the seed 20 after the removal. Gases can be drawn off via a valve 78 by means of a pump 32 and thus the process pressure can be regulated. By means of an upstream valve 79, gas can be supplied to the process chamber for rinsing the crucible support shaft 15. A mass-flow regulator 98 is located upstream of valves 99 and 117 which it supplies, for instance, with argon gas. With a closed flooding valve 74, the valve 99 has the same function as the valve 117. The air lock chamber can be separately pumped down with the aid of the valve 27 and a pump 118; specifically, with a closed flooding valve 74. Argon gas can be supplied from the air lock chamber 23 or to a recharging reservoir 119 via the valves 122 and 123, respectively.

At the left side of the main menu display, a field 124 is shown which indicates the rotational speed of the rod 18 and thus of the crystal 2 in RPM as well as the lifting rate of the crystal in mm/min.

In an additional field 125, the rotational speed of the crucible 7 or the motor 9 in RPM and the lifting rate of this crucible 7 in mm/min are indicated. An additional field 126 displays the electric power consumption and the temperature of a first heater 16, while a field 127 displays the electric power consumption and temperature of a second optional heater, not shown.

In field 128, the supply of raw material to the crucible 7 by an optional feeder device is displayed in grams per minute. The corresponding feeder device is not shown in FIGS. 1 and 3. The gas pressure prevailing in the containers 12,13,14 as well as the gas flow rate are displayed in field 129.

The fields 124–129 are likewise "buttons." Thus, for instance, button 126 shows the current values; if it is pressed, the set-value mask appears in the right half of the display. If button 130 is pressed, then the listed quantities are displayed in a bar graph chart. If button 131 is pressed, the alarm list is displayed. If button 132 is pressed, an appendix 2 appears. If button 134 is pressed, an appendix 4 appears.

In an upper field 130, parameters such as "diameter," "average velocity," "melt bath level," "growth" and "melt temperature 1," as well as "melt temperature 2" are displayed.

A warning bell for malfunctions is displayed in field 131, while a symbol for manual operation is shown in field 132. Field 133 shows the total length of the already drawn crystal.

Figure 4:
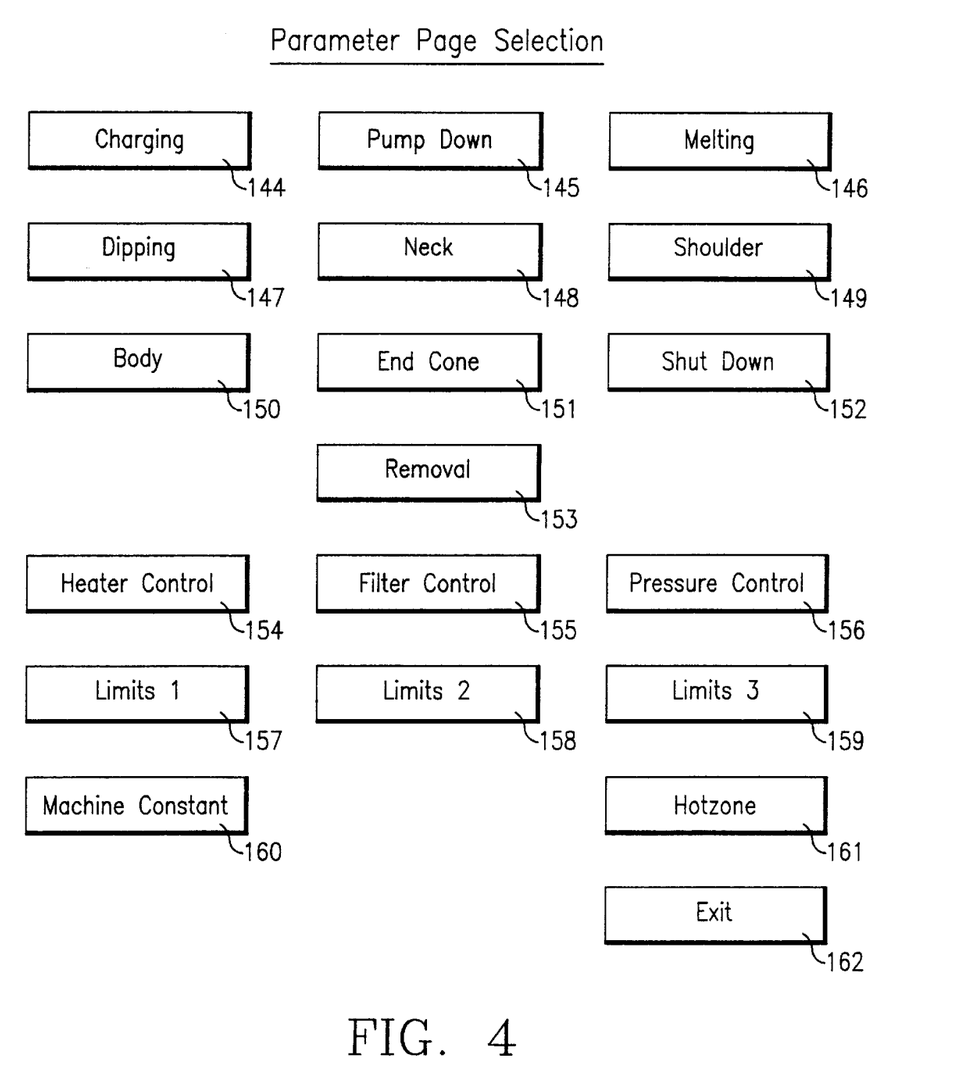
FIG. 4 is a plan of the parameter selection possibilities that appears upon activation of item 137 in FIG. 3.

Underneath the fields 124–135, several buttons 136–143 are indicated which can be clicked on by a cursor. By way of button 143, "Last," the most recently called parameter table is reached. By clicking on the button 137 "Parameters," the "Parameter page selection" arrangement shown in FIG. 4 is called up.

In three columns and eight rows, this arrangement shows various button fields 144–162, which can be clicked on via cursor and mouse. These button fields correspond to the different phases of the growth process. The following can be called up with the individual buttons: button 144: Charging; button 145: Pump Down; button 146: Melting; button 147: Dipping; button 148: Neck; button 149: Shoulder; button 150: Body; button 151: End Cone; button 158: Shut Down; button 153: Removal; button 154: Heater Control; button 155: Filter Control; button 156: Pressure Control; button 157: Limits 1; button 158: Limits 2; button 159: Limits 3; button 160: Machine Constant; button 161: Hot Zone; button 162: Exit. With buttons 148,149,150,151, those areas of the crystal are called up which are illustrated in FIG. 2.

Figure 5:
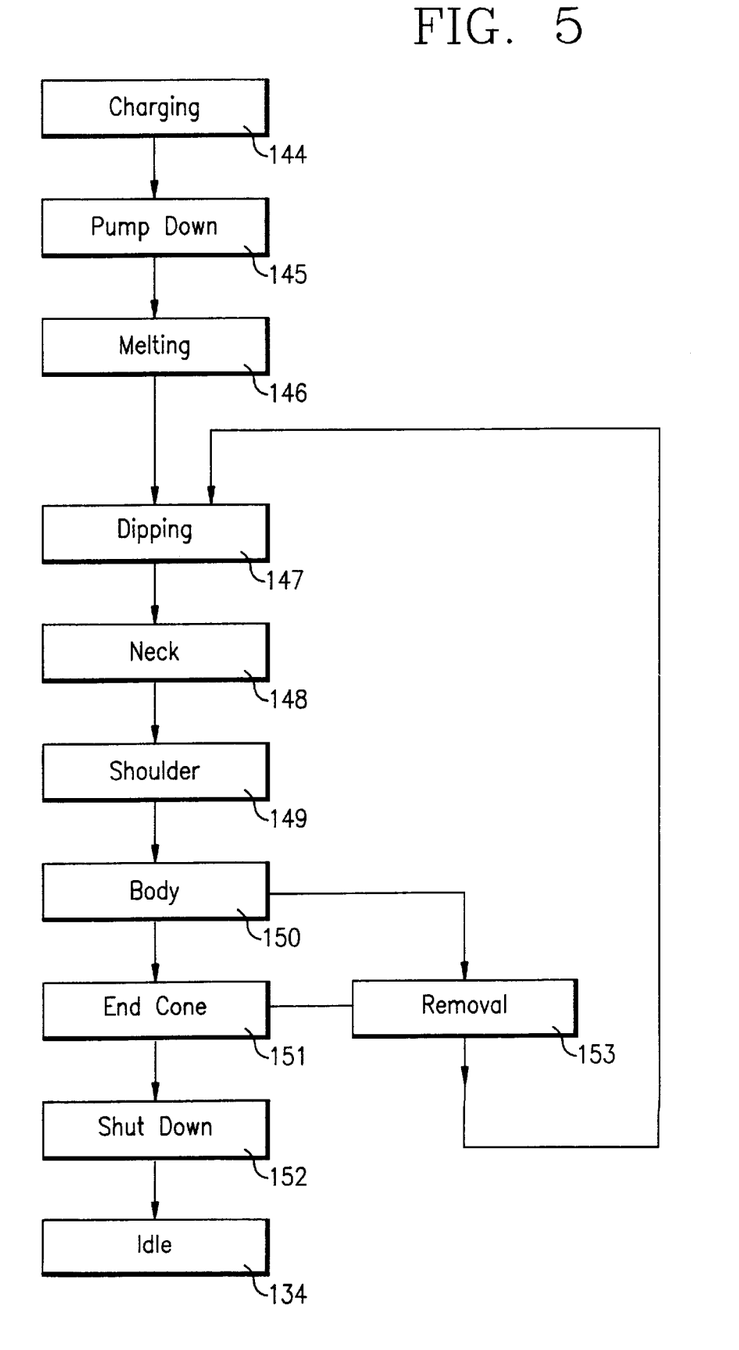
FIG. 5 is a flow chart of the temporal sequence of the activities shown in FIG. 4.

Some of the buttons of FIG. 4 are presented again in FIG. 5, but in the form of a time sequence. From the process shown in the manner of a flow chart, it is recognized that charging first occurs and then pumping down and melting occur. Thereupon, the seed is dipped and first the neck and then the shoulder and the body, respectively, are drawn. If the end cone is reached, a new crystal is grown and the dipping of a new seed begins.

At the end, the system is shut down 152 and emptied, and is idle 134.

In charging, two aspects are considered: the geometry of the crucible and the filling level calculation. The crucible illustrated in FIG. 1 consists in practice of two crucibles placed one inside the other. The larger crucible consists of graphite and serves as a support crucible for a small quartz crucible. The quartz crucible is utilized so that the melt 5 is not contaminated by the graphite crucible. Graphite is completely unsuitable as a crucible material for silicon. The dimensions of the two crucibles are input according to their actual geometry and are changeable. Dimension parameters are, for instance, the wall thickness and the bottom thickness of the quartz crucible, as well as the inside diameter and the radius of curvature between the cylindrical part of the crucible and its bottom.

For the automatic filling level calculation, the weight of the batch of (for instance, silicon) is input and, from it and from the crucible geometry, the filling level is calculated. The filling level can of course also be measured.

After charging, the pump-down takes place. This is understood to mean the evacuation of the container 12,13,14 around the crucible 7, wherein it is ascertained whether this vessel is sealed. Thus, it can take, for instance, 1000 sec until a pressure of 10.0 mbar is reached. After another 1500 sec, a pressure of 1.0 mbar has been reached, while after another 1800 sec, a pressure of 0.1 mbar is present. 2500 sec will have passed until a pressure of 0.05 mbar has finally been reached. If the aforementioned pressures have not been maintained, an alarm message occurs and it can be concluded that there is a leak in the vessel 12,13,14.

After the melting process, the actual crystal-drawing process begins, as will now be discussed further.

Figure 6:
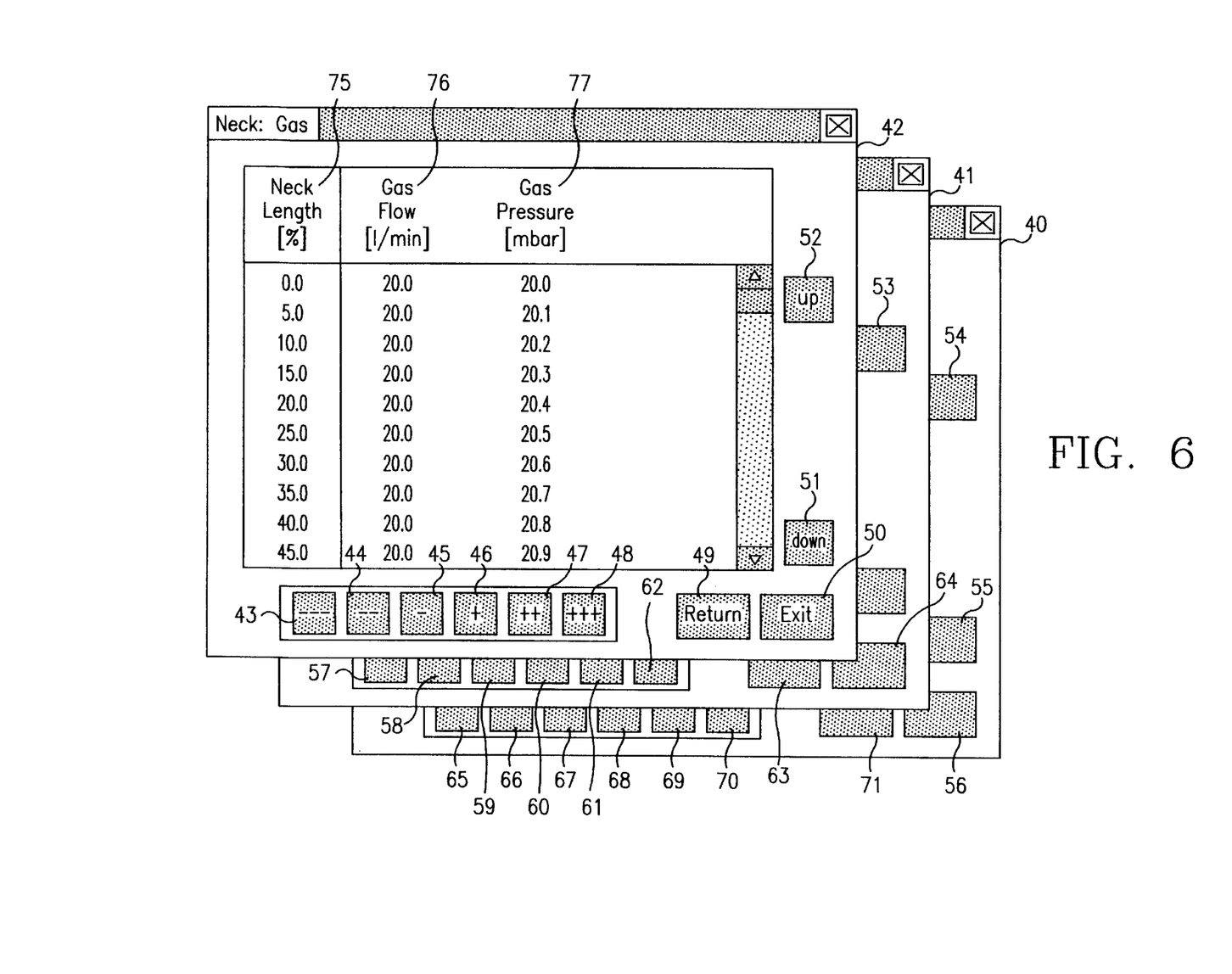
FIG. 6 is a representation of the monitor displays for a crystal growth process in the neck area of the crystal.

If, for instance, the "Neck" button in FIG. 4 is clicked, then a main table appears with buttons to various sub tables, such as 40,41,42, which are represented in FIG. 6. All the sub tables 40,41,42 refer to the neck 29 in the drawing of the crystal 2. The front sub table 42 shows a table which contains the relevant data of the gas for different lengths of the neck 29.

On the left side of the sub table 42, three columns 75,76,77 are recognizable, of which the first column 75 indicates the length of the neck of the crystal as a percentage of the ultimate total neck length. 15% thus signifies that the neck of the growing crystal has reached 15% of its total length. The table is no longer visible past 45% because the values are then covered. The table can, however, be scrolled with the buttons 51,52 (up, down).

The lines arranged one below the other thus represent the states "neck length," "gas flow" and gas pressure at defined times. At point in time t=0, for instance, the neck length is 0% of the total neck length, at point in time t=$t_1$ it amounts to 5% of the total length, and so on. The gas flow and the gas pressure which are associated with the respective neck length are presented in columns 76 and 77. It is recognizable from this display that, at the point in time when the neck length amounts to 30%, a gas flow of 20.0 L/min with a gas pressure of 20.6 mbar prevails.

All the values shown in columns 75,76,77, such as the gas pressure, can be modified with the aid of a cursor.

Modifications can be made by means of the buttons 43–48, where buttons 43–45 stand for decreasing values and buttons 46–48 for increasing values. Button 49 is a return key, while buttons 50,51,52 indicate "Exit," "Down" and "Up." If button 49 is pressed, control returns to the main panel. When button 50 is activated, control returns to the basic layout. Down 51 means one line lower in the table, while Up 52 means one line higher in the table.

The sub tables 41,40 shown in the background feature buttons 57–62 or 65–70, which correspond to buttons 43–48. The other keys 63,64 and 71,56 of the sub tables 41,40, respectively, also correspond to keys 49,50 of the sub table 42. While subordinate panel 42 describes the parameters "gas flow" and "gas pressure" in relation to the neck length, the sub table 41 relates, for instance, to the parameter "rotational speed" in relation to the neck length. For sub table 40, which likewise relates to the neck length, the variable parameter is, for instance, the temperature of the melt.

Sub tables such as those shown in FIG. 6 in conjunction with the neck of a crystal can also be displayed for the shoulder, the cylindrical body and the end cone of the crystal by corresponding clicking on the buttons 149,150 or 151. From this it is recognized that parameters of their own are associated with each area of the crystal shown in FIG. 2, as well as with each process step.

For the other parameters represented in FIG. 4 as well, sub tables which are designed like the sub tables 40,41,42 shown in FIG. 6 also appear if they are clicked. In this way, it is possible in the different process steps, for instance, production of the neck, production of the shoulder, etc., for the profile of the individual process parameters, such as temperature, gas flow, rotational speed, etc., to be specified. For each process step, a series of functions is generated which defines the profile of the various process parameters, for instance, temperature, pressure, diameter, etc., when working through this step.

This process-engineering solution permits the implementing of a great variety of philosophies in the production of a crystal with the same control unit.

In the first column 75 of the sub tables 40,41,42 is that process parameter with which the advancement of the respective process step is described, for instance, the neck length in % during the process step "neck" or the time in the process step "melting." In the coordinate system, the values of this first column 75 can be entered, for instance, on the x axis.

In the additional columns 76,77, other process parameters such as gas flow and gas pressure are presented. These process parameters can appear on the y axis in a coordinate system.

Figure 7:
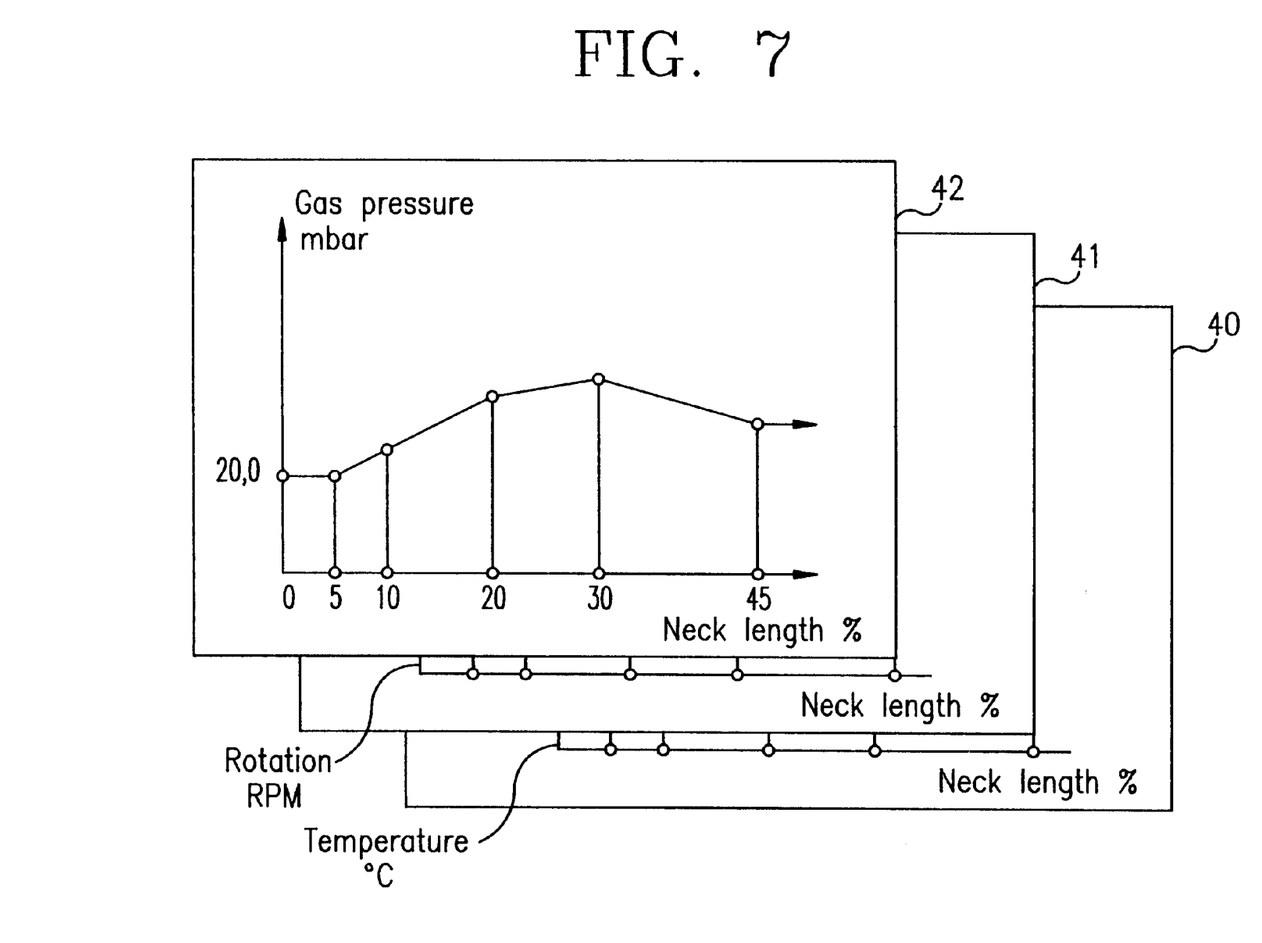
FIG. 7 is a representation of a geometric function calculated from a numerical table similar to FIG. 6.

FIG. 7 shows an example of a plot representation of the dependence of gas pressure on neck length in the coordinate system. In the front sub table 42, the neck length is entered on the abscissa, while the gas pressure is entered on the ordinate.

In sub table 41, the neck length is also entered on the abscissa, but the ordinate is formed by the rotation in RPM of the rod 18.

Finally, the sub table 40, shows the association of neck length and temperature.

As is recognized from FIG. 7, the gas pressure points that correspond to the neck length points 5%, 10%, 20%, 30% and 45% serve as support points for a curve. If no entry is made in the table, the last value is retained up to 100%. A parameter set is always designed for 100% neck length. Since in FIG. 6, however, the parameters can be seen only up to 45%, the parameters are also only presented in FIG. 7 up to 45%. Of course, it is possible to scroll the table shown in FIG. 6 up to its end with the buttons 51,52.

Figure 8:
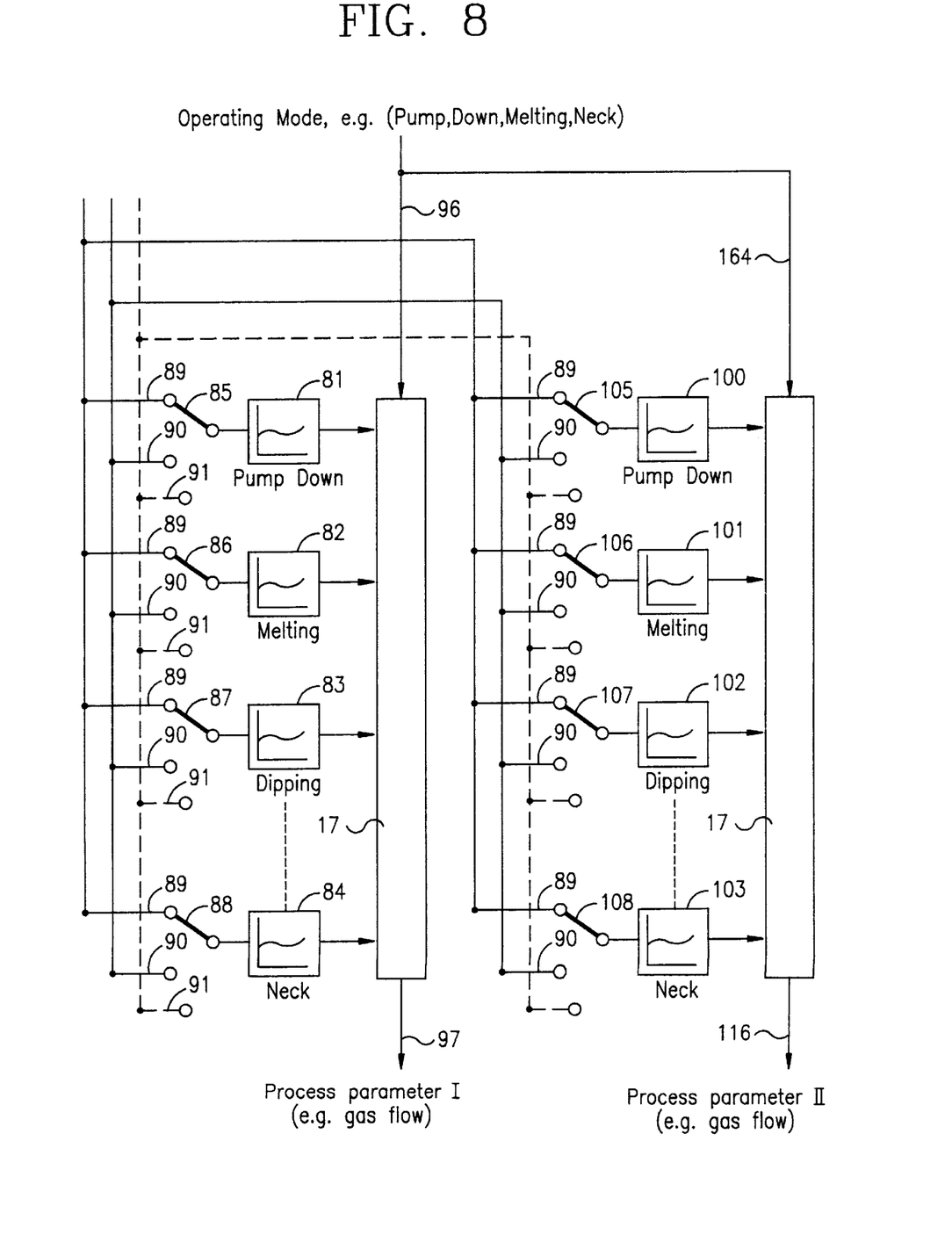
FIG. 8 is a representation of an arrangement for the implementation of process parameters by means of function generators.

These and other curves, as FIG. 8 shows, can be generated by a function generator in such a way that intermediate values between the support points are yielded as interpolated values.

FIG. 8 shows function generators 81–84 and 100–103, each for one operating mode 166, for instance, pump down, melting, neck control of the gas flow, etc., where the function generators 81–84 are responsible for the generation of a first process variable, for instance, the gas flow, while the function generators 100–103 are responsible for another process variable, for instance, the automatic control of the temperature.

In function generator 81, for instance, the curve shown in FIG. 7, sub table 42 is generated, which reproduces the connection between neck length and gas pressure. The function generator 101, on the other hand, generates a curve which is reproduced in the sub table 40 of FIG. 7.

The same applies analogously to the other function generators 82,83,94 and 100,102,103 according to FIG. 8.

The abscissas of the function generators 81–84 and 100–103 can be changed via switches 85–88 and 105–108 to different measured parameters of the lines 89,90,91. The feed lines 89–91 supply the signals from a specified transformer, which is illustrated in the subsequent FIG. 9. These signals are switched through via the switches 85–88 and 105–108 to the function generators 81–84 and 100–103 for the respective operating mode. In the "neck" example, the signal is switched to the function generator 84 via the switch 88. The output 97 carries the set values, for instance, for the gas flow for the neck 40, while the output 116 carries the set values for the temperature. In general, it is several parameters, for instance, gas flow and gas pressure, whose dependence on one control variable, for instance, on neck length, can be represented in this manner, so that one single function generator is sufficient for the representation of two curves by a changeover.

Figure 9:
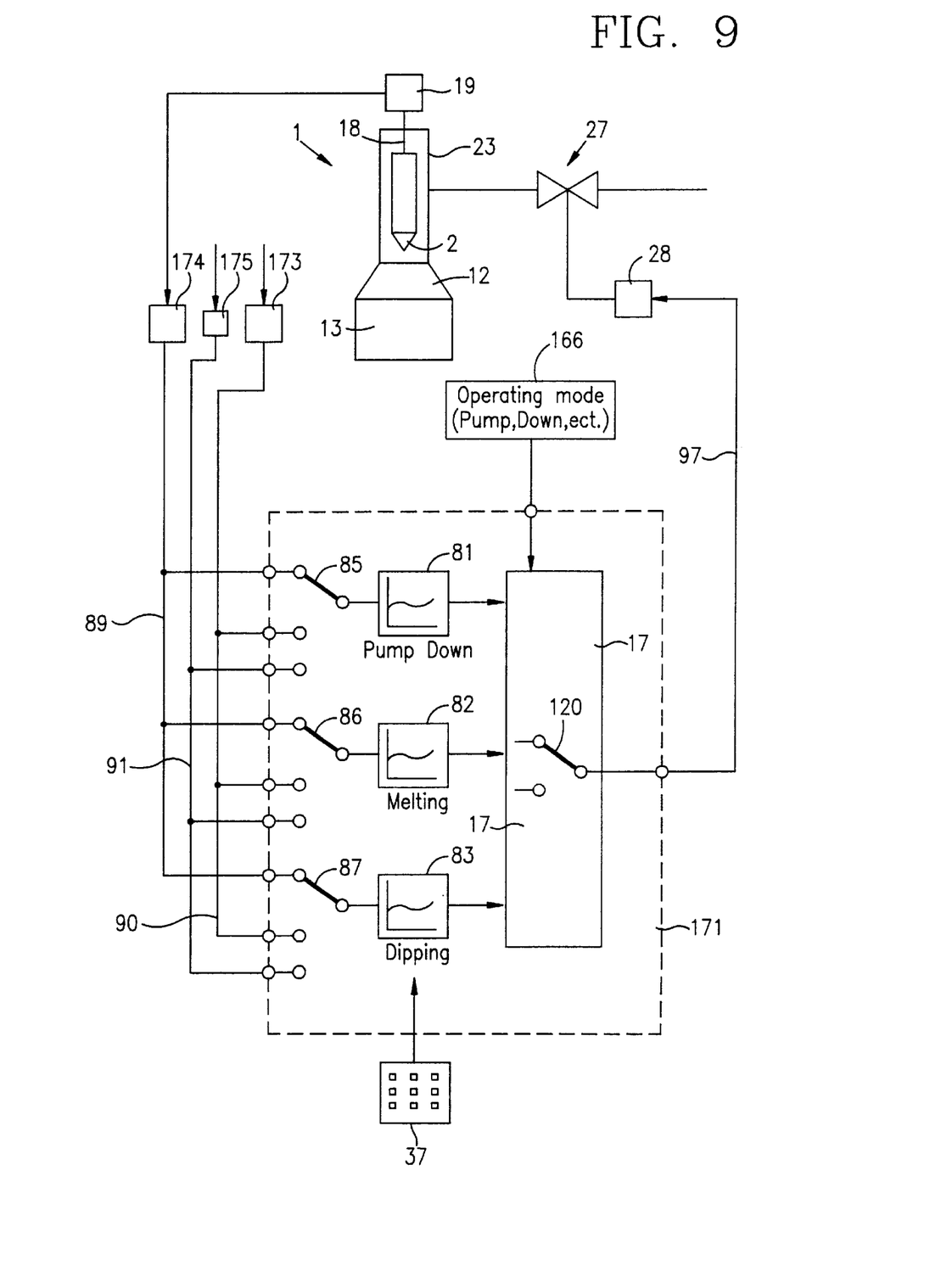
FIG. 9 is a schematic flow diagram of the overall view of the arrangement according to the invention.

In FIG. 9, a schematic overview of the entire system is once again presented in conjunction with the arrangement according to FIG. 8. The device 1 with the containers 12,13, the tube 23, the motor 19 and the valve 27, which is actuated by a servomotor 28, is represented in the upper area. One recognizes here that a process parameter, for instance, the gas pressure measured by a process-state sensor 173, is fed via a line 90 and a switch 85 to a function generator 81, which feeds its function to the device 17 which transfers this function to a signal transformer 28 in order to turn on the valve 27 appropriately.

Devices 173,174,175 are process-state sensors, 174 being a process-state sensor for the crystal-drawing drive which acquires, for instance, the current crystal position. The process-state sensors 173–175 serve, for instance, to ascertain the crystal weight or temperature. The process state values relevant to the respective operating mode can be changed by way of the changeover switches 85,86,87.

The changeover switch 120 is an operating mode changeover switch with which, for each of the output parameters or control utilized for all other parameters, which are reproduced, for instance, in FIG. 4.

The devices for ascertaining process output parameters are controlled by input parameters such as current measured process values, simulated or modeled process values or process-engineering specifications, ramp functions, set values and so on.

The input parameters for the devices for ascertaining process output parameters are also selectable and switchable.

Furthermore, the uniformity of the devices for ascertaining output parameters for all the different process parameters is also utilized for all the different process phases, i.e., operating modes and crystal sections, for automatic comparison or automatic evaluation or automatic documentation of processes conducted in real time.

With the invention, it is possible, among other things, to allow processes to run which the applicants do not know, that is to say "secret" processes can be conducted by, for instance, modifying the prescribed numerical values.

Further variations and modifications of the foregoing will be apparent to those skilled in the art and are intended to be encompassed by the claims appended hereto.

German priority application 198 06 949.9 filed variables to the system, the associated function generator output, for instance, 81, is selected.

As results from the above figure descriptions, the invention pertains to a device for automatic control of crystal growing processes with the aid of measured process values, process parameters and variables, or with the aid of input and output values, each associated with respective different process phases and crystal sections. In addition, a single, universally valid device for obtaining the process output parameters is obtained for the various process strategies and parameter assignments, and without restriction for all different process phases and process strategies.

Consequently, all process variables or output parameters necessary for process control are incorporated into the process control system without exception, so that no process variable or output parameters need be employed outside the process control system. Neither are any process phases or steps regulated or controlled with means outside the aforementioned process control system.

The device for ascertaining the process output parameters for a given operating mode—for instance, a process phase or a crystal section—is always embodied in the same manner.

Thus the same pattern as that illustrated in FIG. 6 is Feb. 19, 1998 is relied on and incorporated herein by reference.

We claim:

1. A device for controlling crystal growth processes in which different process phases are distinguished, comprising detecting means for detecting at least one reaction parameter during at least one process phase to obtain at least one measured value, feeding means for feeding said at least one measured value to an evaluation device which influences at least one process variable, and evaluation means comprising means for allocating each process variable measured during a phase with a defined process variable.

2. The device according to claim 1, wherein the measured process variable is changeable.

3. The device according to claim 1, wherein said allocation means includes means for measuring the melting of a starting material or the cooling of a residual melt or a neck, shoulder or body of a crystal.

4. The device according to claim 1, further comprising means for measuring a neck diameter of a crystal.

5. The device according to claim 1, further comprising means for determining a temperature of a crucible of crystal or crystal turning velocity.

6. The device according to claim 1, further comprising storage means for storing process variables in a memory as numerical data.

7. The device according to claim 6, further comprising display means for displaying process variables in tables.

8. The device according to claim 7, wherein said tables include rows and columns, for listing different numerical values in columns.

9. The device according to claim 8, wherein said device lists in a first column, numerical values for one process parameter, while process data are listed, the quantities or data arranged in a row being associated with one column.

10. The device according to claim 9, further comprising connection means for connecting columns with additional data.

11. The device according to claim 1, further comprising storage means for storing process variables as function curves.

12. The device according to claim 11, further comprising function generators for implementing function curves.

13. The device according to claim 1, further comprising means for specifying time instead of measured values.

14. The device according to claim 1, further comprising a monitor with a screen for displaying at least one process variable numerically as a function of a phase.

15. The device according to claim 1, further comprising means for calling up a display on a screen which represents a crystal-drawing device graphically and wherein said display simultaneously presents fields in which process parameters.

16. The device according to claim 15, wherein the screen representation contains a button, through the activation of which a "Parameter Page Selection" display is presented which shows various process parameter fields.

17. The device according to claim 16, further comprising call up means for calling up at least one panel, which shows a process parameter association between neck length, gas flow or gas pressure or rotation speed.

* * * * *